(12) United States Patent
Kluge et al.

(10) Patent No.: US 10,663,545 B2
(45) Date of Patent: May 26, 2020

(54) METHOD AND APPARATUS FOR LOW-ARTIFACT MAGNETIC RESONANCE FINGERPRINTING SCAN

(71) Applicant: Siemens Healthcare GmbH, Erlangen (DE)

(72) Inventors: Thomas Kluge, Hirschaid (DE); Mathias Nittka, Baiersdorf (DE); Gregor Koerzdoerfer, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 191 days.

(21) Appl. No.: 15/699,935

(22) Filed: Sep. 8, 2017

(65) Prior Publication Data

US 2018/0074145 A1 Mar. 15, 2018

(30) Foreign Application Priority Data

Sep. 15, 2016 (DE) .................. 10 2016 217 675
Apr. 7, 2017 (EP) ................................ 17165569

(51) Int. Cl.

| *G01R 33/48* | (2006.01) |
|---|---|
| *G01R 33/561* | (2006.01) |
| *G01R 33/54* | (2006.01) |
| *G01R 33/56* | (2006.01) |
| *G06T 11/00* | (2006.01) |
| *G01R 33/58* | (2006.01) |

(52) U.S. Cl.
CPC ..... *G01R 33/4818* (2013.01); *G01R 33/4828* (2013.01); *G01R 33/546* (2013.01); *G01R 33/561* (2013.01); *G01R 33/5608* (2013.01); *G06T 11/005* (2013.01); *G01R 33/4806* (2013.01); *G01R 33/58* (2013.01); *G06T 11/003* (2013.01)

(58) Field of Classification Search
None
See application file for complete search history.

(56) References Cited

U.S. PATENT DOCUMENTS 10,180,476 B2 * 1/2019 Cohen ................ G01R 33/4828
10,466,321 B2 * 11/2019 Cohen ................ G01R 33/4818
(Continued)

OTHER PUBLICATIONS

Pierre et al. "Multiscale reconstruction for MR fingerprinting." Magnetic Resonance in Medicine vol. 75 pp. 2481-2492 (2016).
(Continued)

*Primary Examiner* — Jermele M Hollington
(74) *Attorney, Agent, or Firm* — Schiff Hardin LLP

(57) ABSTRACT

In order to execute a low-artifact magnetic resonance fingerprinting (MRF) scan, a preferred order of N k-space trajectories of a sampling pattern is determined in a computer, along which in each case an undersampled scan data set is to be scanned, such that artifacts are avoided in parameter maps created from the scan data sets in an MRF scan. The order in which the N k-space trajectories are to be sampled one after the other is varied, so at least two different orders are produced. According to the orders that result due to this variation, determined test signal characteristics are compared with each other and/or with ideal signal characteristics with respect to their artifact behavior. A preferred order is determined from the resulting orders by taking into account the results of the comparison.

18 Claims, 6 Drawing Sheets

(56) References Cited

U.S. PATENT DOCUMENTS

| | | | |
|---|---|---|---|
| 2014/0218027 A1* | 8/2014 | Fautz | G01R 33/4836 324/309 |
| 2016/0116559 A1* | 4/2016 | Cohen | G01R 33/561 324/309 |
| 2016/0154078 A1* | 6/2016 | Grodzki | G01R 33/50 324/309 |
| 2016/0291107 A1* | 10/2016 | Rosen | G01R 33/543 |
| 2017/0003365 A1* | 1/2017 | Rosen | G01R 33/445 |
| 2017/0139025 A1* | 5/2017 | Cohen | G01R 33/4818 |
| 2018/0074148 A1 | 3/2018 | Pfeuffer | |
| 2019/0086494 A1* | 3/2019 | Pfeuffer | G01R 33/3607 |
| 2019/0137585 A1* | 5/2019 | Bornert | G01R 33/4816 |

OTHER PUBLICATIONS

Cline et. al.: "Accelerated iterative reconstruction for magnetic resonance fingerprinting", Proceedings of the 23rd Annual Meeting of ISMRM, (2016).

Meyer. et. al.: "Dual-Density and Parallel Spiral ASL for Motion Artifact Reduction", in: Proc. Intl. Soc. Mag. Reson. Med.,. vol. 19 p. 3986; (2011).

Hamilton et. al.: "Cardiac MR fingerprinting for T1 and T2 mapping in four heartbeats", in: Hamilton et al. Journal of Cardiovascular Magnetic Resonance, vol. 18 (Suppl 1), (2016).

Koerzdoerfer, et. al.: "Spatial biases in Magnetic Resonance Fingerprinting parameter maps arising from undersampling patterns", Proceedings of the 24rd Annual Meeting of ISMRM. (2017).

Jiang et al; "MR Fingerprinting Using Fast Imaging with Steady State Precession (FISP) with Spiral Readout"; Magnetic Resonance in Medicine; vol. 74; pp. 1621-1631, (2015).

Buonincontri et. al.; "MR Fingerprinting with Simultaneous B1 Estimation"; Magnetic Resonance in Medicine 00:00-00 (2015).

Hong, et. al.: "B1+ inhomogeneity compensated MRF using simultaneous AFI", in: Proc. Intl. Soc. Mag. Reson. Med., vol. 23 p. 3248; (2015).

Cloos, et. al.: "Multiparametric imaging with heterogeneous radiofrequency fields", :Nature Communications,. (2016).

Ma et al. "Magnetic resonance fingerprinting", Nature, vol. 495, No. 7440, pp. 187-192, (2013).

Mc Givney et al.:"SVD Compression for Magnetic Resonance Fingerprinting in the Time Domain"; IEEE Trans. Med. Imaging 33; pp. 2311-2322; (2014).

Hamilton et. al.: "Pulse Sequence Optimization for Improved MRF Scan Efficiency",: Proc. Intl. Soc. Mag. Reson. Med., vol. 23, p. 3386; (2015).

Sommer et. al.: "Towards Judging the Encoding Capability of Magnetic Resonance Fingerprinting Sequences",: Proceedings of the 23rd Annual Meeting of ISMRM., (2016).

Pfeuffer, et. al.: "Mitigation of Spiral Undersampling Artifacts in Magnetic Resonance Fingerprinting (MRF) by Adapted Interleave Reordering",: Proc. Intl. Soc. Mag. Reson. Med. 25 (2017).

Chung et al. Rapid B1+ Mapping Using a Preconditioning rF Pulse with TurboFLASH Readout Magnetic Resonance in Medicine vol. 64; pp. 439-446 (2010).

Ma. et. al.: "Music-Based Magnetic Resonance Fingerprinting to Improve Patient Comfort During MRI Examinations", Magnetic Resonance in Medicine, vol. 75, pp. 2303-2314 (2016).

Gao. et. al: "Preclinical Magnetic Resonance Fingerprinting (MRF) at 7 T: Effective Quantitative Imaging for Rodent Disease Models", NMR Biomed. vol. 28(3), pp. 384-394 (2015).

Pipe et. al.: "Effects of Interleaf Order for Spiral MRI of Dynamic Processes", in: Magnetic Resonance in Medicine, vol. 41, pp. 417-422, (1999).

Asslaender. et. al.: "Pseudo Steady-State Free Precession for MR-Fingerprinting", Magnetic Resonance in Medicine, (2016).

Cheng et. al.: "Practical Medical Applications of Quantitative MR Relaxometry", in: Journal of Magnetic Resonance Imaging, vol. 36, pp. 805-824 (2012).

Tan et. al,: "Estimation of k-Space Trajectories in Spiral MRI", in: Magnetic Resonance in Medicine, vol. 61, pp. 1396-1404 (2009).

Ma et. al,: "Slice Profile and B1 Corrections in 2D Magnetic Resonance Fingerprinting", Magnetic Resonance in Medicine, (2017).

Tsao et al., "Lattice Permutation for Reducing Motion Artifacts in Radial and Spiral Dynamic Imaging," Magnetic Resonance in Medicine, vol. 55, pp. 116-125 (2006).

Wang et al., "Magnetic Resonance Fingerprinting with compressed sensing and distance metric learning," Neurocomputing, vol. 174, pp. 560-570 (2016).

Sbrizzi et al., "Dictionary-free MR Fingerprinting with low-pass balanced-GRE sequences," Proceedings of the International Society for Magnetic Resonance in Medicine, ISMRM 25th Annual Meeting and Exhibition (2017).

* cited by examiner

METHOD AND APPARATUS FOR LOW-ARTIFACT MAGNETIC RESONANCE FINGERPRINTING SCAN

BACKGROUND OF THE INVENTION

Field of the Invention

The present invention concerns methods for reducing artifacts in parameter maps created by magnetic resonance fingerprinting.

Description of the Prior Art

Magnetic resonance (MR) technology is a known modality with which images of the inside of an examination object can be generated. Simply described, the examination object is positioned in a magnetic resonance scanner in a strong, static, homogeneous basic magnetic field, also called $B_0$ field, having field strengths of 0.2 tesla to 7 tesla and above, so the nuclear spins of the object orient themselves along the basic magnetic field. To excite nuclear spin resonances, radio-frequency (RF) excitation pulses are radiated into the examination object, the signals produced by the excited nuclear spin resonances are detected and entered into a memory as what is known as k-space data, and MR images are reconstructed on the basis thereof or spectroscopy data are determined. Rapidly switched magnetic gradient fields are overlaid on the basic magnetic field for spatially encoding the detected data. The recorded data are digitized and stored in a k-space matrix as complex numerical values. This filling of k-space is called scanning k-space, so the acquired k-space data are called scan data. This entry of data into k-space is also called sampling k-space. An associated MR image can be reconstructed from the k-space matrix occupied by such values, for example by a multi-dimensional Fourier transform.

Magnetic resonance imaging with a magnetic resonance system can be used to determine the presence and/or distribution of a substance located in an examination object. The substance can be, for example, a suspected pathological tissue of the examination object, a contrast medium, a marking substance, or a metabolic product.

Information about the substances that are present can be obtained in a variety of ways from the recorded scan data. A relatively simple source of information is, for example, image data reconstructed from the scan data. These conventional sequences usually used in clinical routine only generate a relative signal intensity of different tissue types (known as weightings), so the diagnostic interpretation is to a large extent dependent on the subjective assessment of the radiologist.

In contrast to this, with the use of quantitative MR imaging techniques, absolute properties of the scanned examination object may be determined in humans, for example in particular the tissue-specific T1 and T2 relaxation. The property can be represented, for example, as parameter maps, which reproduce the parameter values such as the respective relaxation times, in a spatially resolved manner. Quantitative techniques therefore provide the advantage of an objective comparability but, due to long scanning times, are currently rarely used as a matter of routine.

With the use of newer scanning methods, such as magnetic resonance fingerprinting methods (MRF methods), the drawback of long scanning times can be reduced to an acceptable extent. The principle of these methods is to generate, by pseudo random variation of sequence parameters (flip angle, TR, gradient, . . . ), optimally different signal characteristics for various substances, and to compare these with a large number of signal characteristics simulated in advance. The totality of the signals simulated in advance is called a "dictionary". Signal characteristics are simulated for various combinations of T1 and T2 relaxation times or the desired tissue parameters. The parameter values of an image point (pixels, or voxels) in the image are determined by comparing the scanned signal characteristic with all simulated signal characteristics. This process is called "matching". The simulated characteristic which is most similar to the scanned one determines the relaxation parameters, for example T1 and T2, of the pixel in question, which, in turn, allows conclusions to be made as to the tissue from which the MR signal originated in order to create that pixel.

Magnetic resonance fingerprinting methods are described, for example, in the article by Ma et al., "Magnetic Resonance Fingerprinting", Nature, 495: p. 187-192 (2013) and in the article by Jiang et al., "MR Fingerprinting Using Fast Imaging with Steady State Precession (FISP) with Spiral Readout", Magnetic Resonance in Medicine 74: p. 1621-1631 (2015).

For MRF methods, basically any echo technique can be used in combination with any method for k-space sampling (Cartesian, spirals, radial) for recording the scan data.

In aforementioned article by Jiang et al. an MRF method is described in which an FISP ("Fast Imaging with Steady State Precession")-sequence is used, which is repeated 1,000 times with variation of the repetition time TR and the flip angle, with scan data being recorded along a spiral k-space trajectory with each repetition. Twenty-four repetitions are required in the described method in order to fully sample the k-space center with the k-space trajectory according to the Nyquist theorem, and as many as 48 repetitions in order, as a whole, to achieve a resolution of 256*256 at which peripheral k-space is also fully sampled according to the Nyquist theorem. The k-space trajectory that is used is therefore rotated by an angular increment of 360°/48=7.5° in each repetition. A scan data set of an individual repetition, from which image data are reconstructed, is therefore undersampled by a factor of 48. The reconstructed image data, from which the multiple image point time series, which are to be compared with the database are created, therefore have pronounced undersampling artifacts. Although Jiang et al. conclude in the article that these undersampling artifacts average out overall, and therefore do not have any effect on the parameter maps that are obtained as results of the comparison with the database, spatial, incorrect deviations/shifts ("spatial bias"), which are also called shading artifacts, can nevertheless occur in the parameter maps.

The use of k-space trajectories with high undersampling factors is a central component for time-efficient implementation of quantitative MR methods such as MRF. Negative effects in the form of artifacts, which have resulted from this undersampling, are therefore a problem. Subsequently published DE102016217675 describes how the effects of such undersampling artifacts can be reduced in parameter maps of an examination object generated by MR fingerprinting. The exact causes and dependencies that lead to the occurrence or avoidance of these errors are not yet understood.

SUMMARY OF THE INVENTION

An object of the invention is to avoid or reduce said artifacts, in particular in parameter maps created by means of MR fingerprinting.

The inventive method determines a preferred order of N k-space trajectories along which (in the preferred order one after the other) an undersampled scan data set is in each case to be scanned for a magnetic resonance fingerprinting (MRF) scan. The method has the following steps.

A sampling pattern is chosen in a computer that is composed of N k-space trajectories, along which scan data can be recorded so that a Nyquist undersampled scan data set can be created from the scan data scanned (entered) along at least one of the N k-space trajectories. In the MRF procedure, a signal characteristic of at least one sample image point, reconstructed from each undersampled scan data set, can be determined, and one parameter of the examination object can be determined for each reconstructed image point from the determined signal characteristics, by comparing the determined signal characteristics with a comparison rule.

In accordance with the invention, the order in which the N k-space trajectories are to be sampled one after the other is varied in the computer, so at least two different (variant) orders are produced.

Test signal characteristics are determined according to the respective orders resulting from the respective variations, and are compared with each other and/or with ideal signal characteristics.

A preferred order, among the resulting variant orders, is determined in the computer by taking into account the results of the comparison. This preferred (determined) order is then used in the MRF scan.

The inventive method allows an optimized choice of the order of k-space trajectories of a sampling pattern, even with high undersampling rates, with which artifacts in parameter maps determined by MRF can be avoided, or at least reduced. With the inventive method, the expected artifacts can be described for a chosen sampling pattern and can be evaluated, for example using at least one measured value. Disadvantageous sampling patterns thus can be avoided. The inventive method therefore allows a simple and fast choice and evaluation of various chosen sampling patterns, and optimized reordering of the respective sampling orders for MRF methods. With the inventive method, time expended for test scans of an almost limitless quantity of possible sampling patterns having different undersampling rates and their respective possible reorderings in the sequence of sampling of the respective k-space trajectories, can be avoided.

With the inventive method, the dependency of the artifacts on the image content of the imaged examination object, for example the imaged anatomy, is included in the comparison. The artifact behavior thus can be examined and optimized for various applications or anatomies. The inventive method can be applied to all sampling patterns and any fingerprint designs (encoding of the signal over time, sampling orders).

The invention is based, inter alia, on the insight that a sampling pattern having a particular order, in which the encompassed k-space trajectories are scanned and from which the MRF signal results, generates specific spatial aliasing in each case. The artifacts of the undersampling dominate other signal variations here, such as those due to system imperfections. Reordering over time of the sequence of the k-space trajectories therefore corresponds to a reordering of the undersampling artifacts. Sampling patterns having a sampling order, which generate incoherent artifacts, are therefore better suited to MRF methods, since these are of less consequence when matching, as expected by Jiang in the cited article. Determination of the preferred order can include a determination of a measured value that reproduces an inconsistency of artifacts contained in image data reconstructed from undersampled scan data sets determined according to the resulting orders.

Determination of the preferred order can additionally or alternatively include a simulation of artifacts contained in image data, reconstructed from undersampled scan data sets determined according to the resulting orders. The simulation can be done for a digital phantom as the examination object. A simulation is possible without great effort for an infinitely large number of potential sampling patterns and sampling orders, and still requires only short actual scanning times of the magnetic resonance system. The simulation allows a direct representation of the expected artifacts in parameter maps obtained by MRF methods.

The measured value and the simulation both allow an objective assessment of artifacts to be expected with a desired sampling pattern and a sampling order.

With the inventive method for scanning scan data of an examination object for a magnetic resonance fingerprinting method and with the inventive method for creating parameter maps of an examination object by magnetic resonance fingerprinting, the detected data are scanned along k-space trajectories in a preferred order determined according to the method described herein.

An inventive magnetic resonance apparatus has a magnetic resonance data acquisition scanner with a gradient coil arrangement, a radio-frequency (RF) antenna and a control computer configured to implement the inventive method. The scanner has an RF transceiver controller with a multiband RF pulse unit.

The present invention also encompasses a non-transitory, computer-readable data storage medium encoded with programming instructions (program code) that, when the storage medium is loaded into a computer of a magnetic resonance apparatus, cause the computer to operate the magnetic resonance apparatus in order to implement any or all of the embodiments of the method according to the invention, as described above.

The advantages and other statements above with respect to the method for determining a preferred order along which, in the preferred order one after the other, scan data sets for magnetic resonance fingerprinting methods are acquired, apply to the method for scanning scan data, the method for creating parameter maps and to the magnetic resonance apparatus, and the electronically readable data storage medium.

DESCRIPTION OF THE PREFERRED EMBODIMENTS

Figure 1:
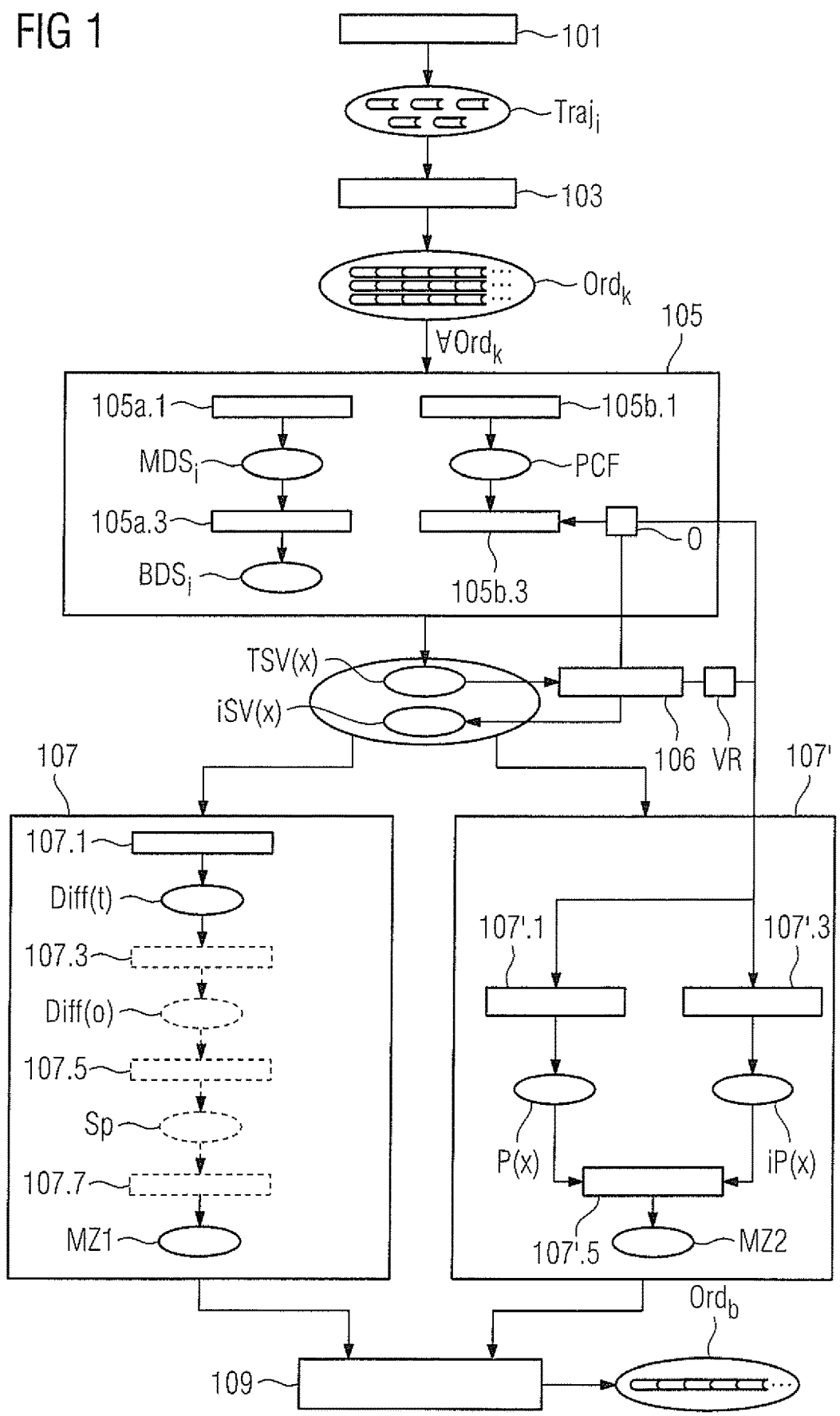
FIG. 1 is a flowchart of the inventive method for determining a preferred order of N k-space trajectories.

FIG. 1 is a flowchart of the inventive method for determining a preferred order of N k-space trajectories along which in each case (in the preferred order one after the other) an undersampled scan data set is to be scanned for a magnetic resonance fingerprinting scan.

A sampling pattern is chosen (block 101) which has N (N>1) k-space trajectories $Traj_i$ (i=1, N) along which scan data can be recorded such that a Nyquist undersampled scan data set can be created from scan data scanned along one of the N k-space trajectories $Traj_i$ in each case. A signal characteristic of at least one same image point of the image data sets can be determined from at least two image data sets reconstructed in each case from one of the undersampled scan data sets. By comparing the determined signal characteristics with a comparison rule, one parameter of the examination object can be determined per reconstructed image point from the determined signal characteristics, as is described below with reference to FIG. 2.

The k-space trajectories can be spiral, radial or Cartesian. The k-space trajectories Traji can, in particular, be chosen in such a way that scan data scanned along all N k-space trajectories $Traj_i$ together produce a scan data set fully sampled according to the Nyquist theorem.

The order (sequence) in which the N k-space trajectories $Traj_i$, should be sampled (filled with data entries) one after the other is varied (block 103), so at least two different orders $Ord_k$ (k>1) result. A random variation can be performed, although a periodic variation can also be performed. The periodic variation can be, for example, a rotation about a certain angular increment, for example a natural multiple of the angle 360°/N, or an offset in a spatial direction, in particular an offset by, in each case, a periodic step continued in k-space. With an identical periodic rotation or with an identical periodic offset, a further variation can be achieved by varying the start k-space trajectory ("offset").

Test-signal characteristics TSV(X) are determined in accordance with the orders $Ord_k$ resulting due to the variation (block 105), in order to be able to compare them with ideal signal characteristics and/or with each other (blocks 107, 107′).

The test signal characteristics for comparison of the orders ($Ord_k$) can be determined for at least one same image point from each of the image data sets $BDS_i$ (block 105a.3) reconstructed from undersampled scan data sets $MDS_i$ scanned in test scans (block 105a.1) along the N k-space trajectories $Traj_i$, in the orders resulting in each case. An image data set has at least one image point x. A comparison of the orders $Ord_k$ can therefore include test scans 105a.1 for determining first test signal characteristics. Test scans of this kind can be carried out on different examination objects, so in each case a preferred order $Ord_b$ can be determined for different examination objects, for example with respect to different medical issues.

The more N k-space trajectories $Traj_i$, that are used for determining the test signal characteristics, by reconstructing image data sets from the associated scan data sets, of which at least one image point is considered, and the more image points that are considered per reconstructed image data set, the more significant the comparison is. The N k-space trajectories can also be scanned several times in the examined order $Ord_k$ so as to obtain a number of signal characteristics of the at least one image point x for a particular order $Ord_k$. As a result, the significance of the comparison can be increased further, for example by forming averages.

Figure 3:
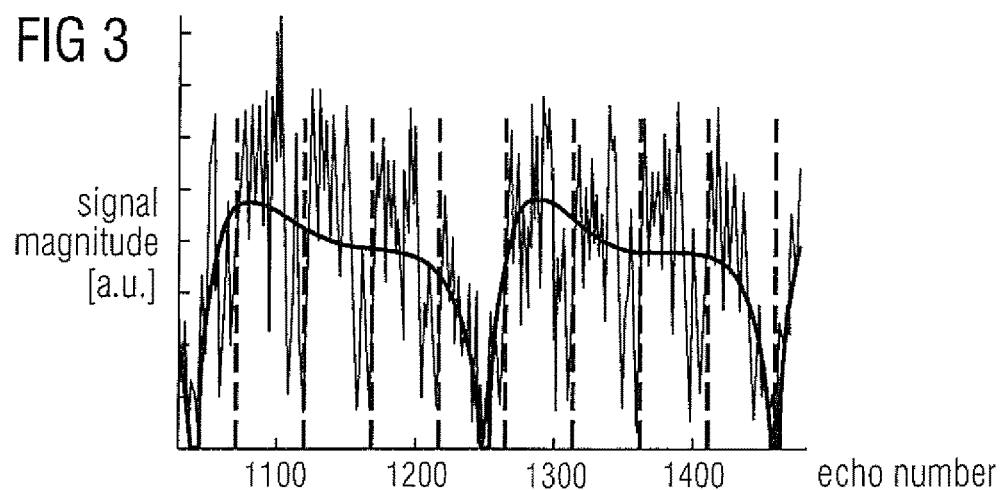
FIG. 3 shows a detail of scan values repeatedly scanned in an order $Ord_k$ for explaining the inventive method.
Figure 4:
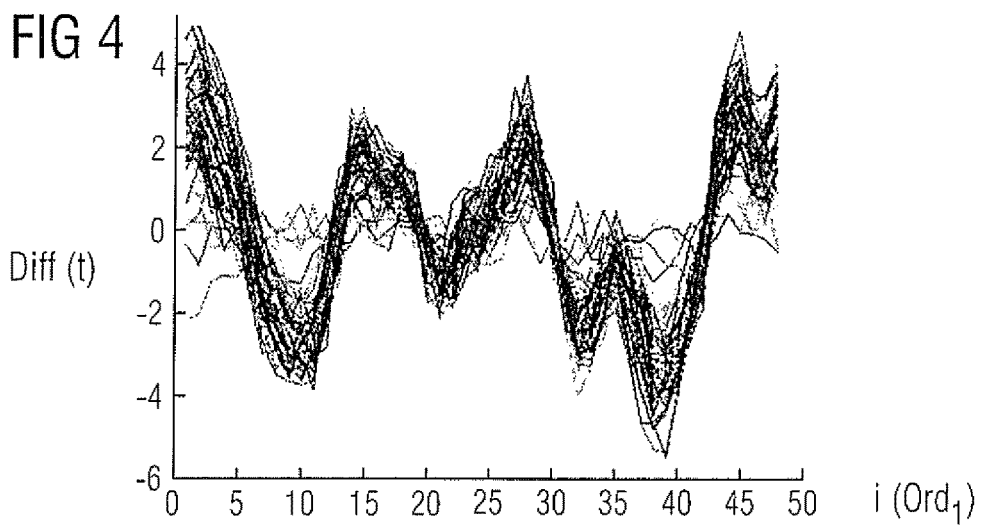
FIG. 4 shows examples of differential signals Diff(t) for various scans of an order $Ord_1$.
Figure 5:
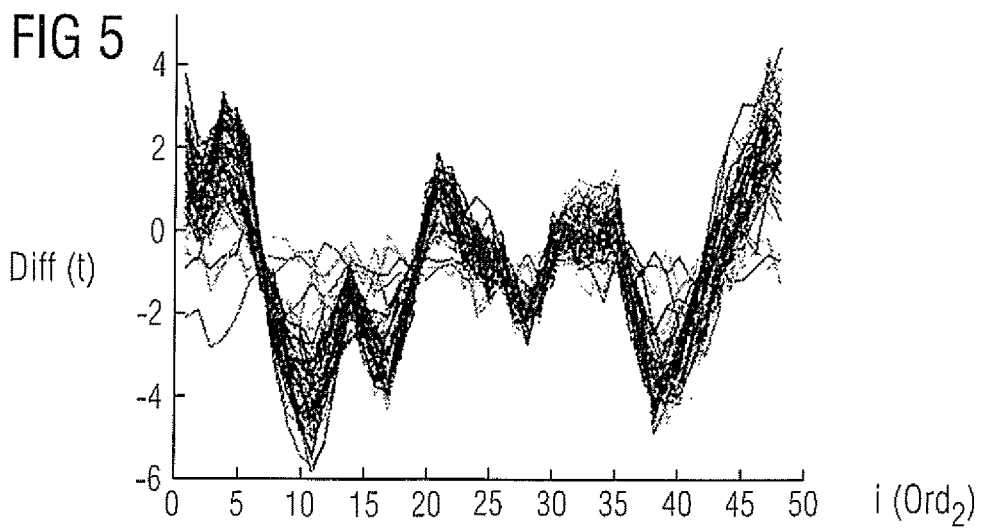
FIG. 5 shows examples of differential signals Diff(t) for various scans of an order $Ord_2$.
Figure 6:
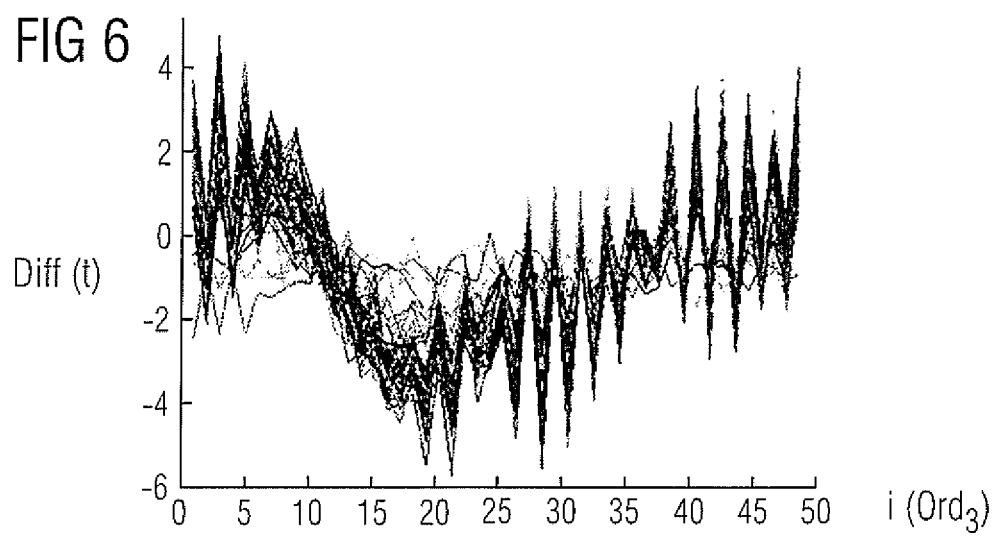
FIG. 6 shows examples of differential signals Diff(t) for various scans of an order $Ord_3$.
Figure 7:
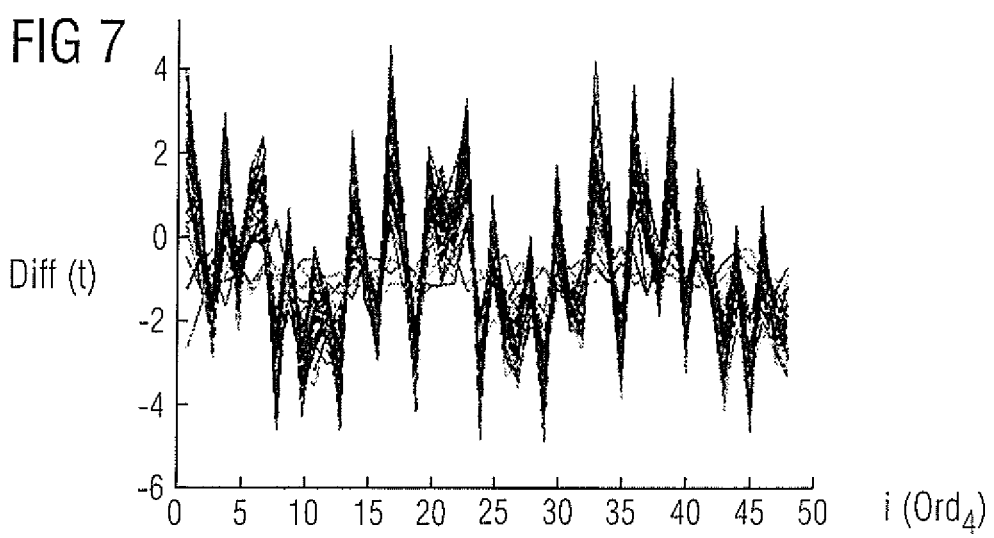
FIG. 7 shows examples of differential signals Diff(t) for various scans of an order $Ord_4$.

One example of test scans of this kind is given in FIG. 3, which shows a detail of signal magnitudes scanned one after the other in a scan process with a fixed order $Ord_k$ over the echoes generated according to the order $Ord_k$ by sampling the k-space trajectories (strongly varying, "wriggling" graph). In this example, the number of scanned echoes exceeds by a multiple the number N of k-space trajectories, so a number of signal characteristics is obtained per image point and order $Ord_k$. The scanned cycles, i.e. the respective passes of the examined order $Ord_k$, are separated from each other in FIG. 3 by broken vertical lines.

Additionally or alternatively, test signal characteristics can be determined for the comparison of the orders ($Ord_k$) by simulation. For this purpose, determination of a (foreign) component of a signal can be at least one image point for each of the N k-space trajectories $Traj_i$, which image point was in each case reconstructed from a scan data set scanned along one of the k-space trajectories. This foreign component should be associated with other image points (block 105b.1). This component therefore matches the component of the signal of an image point that is aliased from all other image points. This can be achieved by calculating the function designated "Point Collection Function" (PCF). According to the invention the PCF results from the known "Point Spread Function" (PSF) as follows:

$$PCF(x_1,x_2)=\int \delta(x'-x_2)PSF(x',x_1)dV'=PSF(x_2,x_1).$$

PCF ($x_1$, $x_2$) therefore describes the signal component that was incorrectly associated with the image point $x_2$ by the image point $x_1$. This corresponds to the PSF (x2, x1), which describes how much signal of the image point $x_2$ must actually be associated with the image point $x_1$. The associated PCF thus can be determined for at least one image point x, as the foreign component for each of the N k-space trajectories $Traj_i$.

Test signal characteristics TSV(X) can be determined (block 105b.3) with the use of the determined foreign signal components, described, for example, by the PCF, of an image point. A test signal characteristic TSV(X)′ of an image point $x_1$ can be determined with the use of the PCF by, for all instants $t_N$, calculating the signal $I(x_1)$ as follows:

$$I(x_1)=\int PSF(x_1,x_2)O(x_2)dx_2,$$

where $O(x_2)$ designates the intensity of respective point sources for each image point $x_2$, with O being a description of the examination object, as the distribution of point sources. Associated with each instant $t_N$ of the signal characteristics is one of the N k-space trajectories, whose order is specified by the order $Ord_k$. Digital phantoms, for example, which can also be individually adjusted on the basis of real scanning conditions (for example coil sensitivities, inhomogeneities in magnetic and high-frequency fields of magnetic resonance systems to be used) and real examination objects, can be used as a description O of this kind of an examination object. Descriptions O can be used for a variety of examination objects, for example homogeneous, those describing a number of different adjoining tissues, or imaging different anatomies, in order to determine individually preferred orders $Ord_b$ in each case for the respectively described, different examination objects.

Furthermore, first ideal signal characteristics iSV(x) of the appropriate image points x corresponding to the specific test signal characteristics TSV(x) can be determined (block 106). A best comparison signal characteristic of the dictionary is determined with an MRF method using a suitable comparison rule VR and an associated dictionary. This characteristic corresponds best with the test signal characteristics, and can be determined, for example, as an ideal signal characteristic iSV(x). One example of such an ideal signal characteristic is shown in FIG. 3 by the solid line in each graph, situated roughly in a middle region of the scanned signal magnitudes.

If at least one parameter value is known, the ideal signal characteristics iSV(x) can be determined from those comparison signal characteristics of a dictionary of a suitable MRF comparison rule VR, which best match the parameters of the examination object known, for example for an examination object described by the description O. For example, the comparison signal characteristic, which is associated with a parameter value that best matches the known parameter value, can be determined as the ideal signal characteristic iSV(x).

A comparison 107 of the test signal characteristics TSV(x) with ideal signal characteristics iSV(x) can include forming a differential signal Diff(t) of the determined first test signal characteristics TSV(x) with their corresponding determined first ideal signal characteristics iSV(x) (block 107.1). The formed differential signals can be taken into account when determining the preferred order. If the N k-space trajectories $Traj_i$, were scanned several times in an examined order $Ord_k$ to obtain a number of signal characteristics SV(x) of the at least one image point x for a specific order $Ord_k$, the differential signals Diff(t) in each case formed for a specific order $Ord_k$ can be averaged, for example, and the averaged differential signal Diff(t). Therefore, just one differential signal Diff(t) can again be considered per order $Ord_k$.

FIGS. 4 to 7 each show, as an example, a number of differential signals Diff(t) in random units over the sequence of the k-space trajectories $Traj_i$, due to the respective order $Ord_1$, $Ord_2$, $Ord_3$ or $Ord_4$ i. The number of differential signals Diff(t) plotted one above the other in each of the FIGS. 4 to 7 can be determined here, for example, from a signal magnitudes characteristic as shown in FIG. 3. It is possible to obtain, for each cycle of the respective order, a differential signal Diff(t) by forming the respective differences from the respective ideal signal, and to plot these differential signals Diff(t) in each case according to the sequence i of the k-space trajectories $Traj_i$, due to the respective order $Ord_1$, $Ord_2$, $Ord_3$ or $Ord_4$. From the number of differential signals Diff(t) of an image point determined in relation to an order $Ord_k$, as are shown in FIGS. 4 to 7 respectively, a joint value, for example a mean, can also be determined for each order considered and each image point considered, so only one (for example the averaged) differential signal Diff(t) can be considered per order and image point.

For better comparability of the various orders $Ord_k$, the examined differential signals Diff(t) can also be reordered according to a fixed sequence in relation to one differential signal Diff(o) in each case (block 107.3). For example, the fixed sequence can arrange the N k-space trajectories $Traj_i$, such that it is not the chronological sequence thereof that is different for each order $Ord_k$ but rather the spatial arrangement thereof that specifies the fixed sequence. With radial or spiral N k-space trajectories, which are each rotated, for example, about an angle of 360°/N with respect to each other, the fixed sequence can be specified by the angle (for example 0°, 360°/N, 2*360°/N, . . . ), or, for example, for Cartesian k-space trajectories, by steps of one "k-space edge" to the next. In any case the differential signals Diff(t) are reordered such that differential values, which can be associated with one of the N k-space trajectories, are accordingly located at an identical position in each reordered differential signal Diff(o) for all examined orders $Ord_k$. The differential signals obtained by the different orders $Ord_k$ can be compared better in this way.

Figure 8:
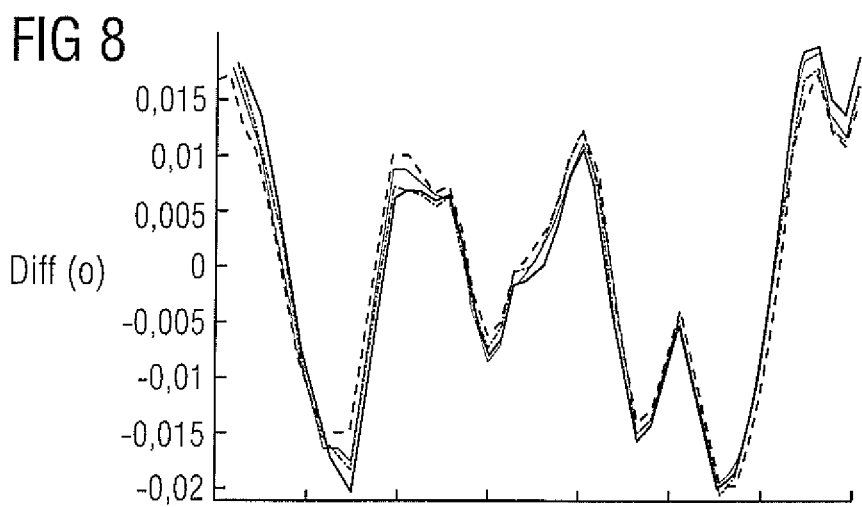
FIG. 8 shows a comparison of differential signals Diff(t) averaged for each order of FIGS. 4 to 7, which have been reordered according to a fixed sequence to form average differential signals Diff(o).

FIG. 8 shows an example of a comparison of this kind in which the differential signals Diff(t), averaged for each order $Ord_1$, $Ord_2$, $Ord_3$ or $Ord_4$ of FIGS. 4 to 7 are plotted. Those differential signals Diff(t) were reordered according to a fixed sequence so as to form reordered differential signals Diff(o). Each of the illustrated graphs shows the (in the illustrated example, averaged) reordered differential signal Diff(o) of one of the orders $Ord_1$, $Ord_2$, $Ord_3$ or $Ord_4$.

Furthermore, one frequency analysis of the formed differential signals Diff(o) considered in a fixed sequence can be carried out for each order $Ord_k$ (block 107.5), so as to be able to compare the spectra Sp of the differential signals Diff(o) of the different orders $Ord_k$. The frequency analysis can be created, for example, by a Fourier analysis of the differential signals Diff(o). Consideration of the spectra of the reordered differential signals Diff(o) allows determination of an inconsistency of artifacts contained in image data reconstructed from scan data sets undersampled according to the resulting orders $Ord_k$. Low frequencies in the determined spectra Sp indicate only a slow change in errors due to undersampling artifacts. High frequencies in the determined spectra Sp point, by contrast, to a desired fast change, i.e. high variability, of the artifacts. Therefore, orders $Ord_k$ of sampling patterns which contain higher frequencies in a spectrum Sp of this kind are preferred.

The results of the frequency analysis, i.e. the obtained spectra Sp, can also be weighted so that, for example with a weighting function, low frequencies are weighted higher than high frequencies (block 107.7). Those spectra with the desired properties (higher frequencies) can be distinguished more easily from spectra with the undesirable properties (lower frequencies) by this kind of weighting of the spectra, since the undesirable low frequencies will be more conspicuous.

For example, by summation of a weighted spectrum of this kind per order over the frequencies of the spectrum, and optionally also a summation over all image points x considered with respect to this order, one measured value MZ1 can be determined per order $Ord_k$, with which the effects of the undersampling artifacts of this order $Ord_k$ can be objectively estimated in MRF methods. The undesirable low frequencies in the spectra are weighted high by the weighting and the desired high frequencies in the spectra are weighted low. Orders with low measured values MZ1 of this kind are therefore preferred compared to orders with higher measured values MZ1.

Figure 9:
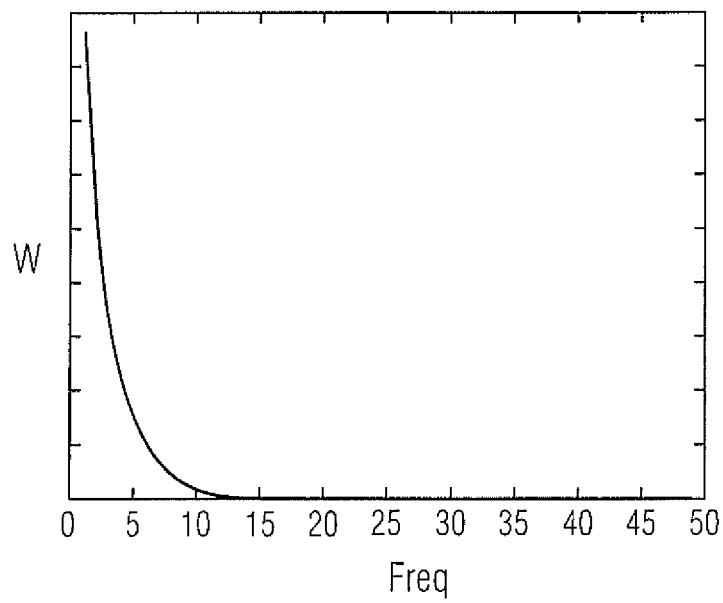
FIG. 9 shows an exemplary weighting function as can be used in the inventive method for weighting.

FIG. 9 shows an example of a weighting function W suitable for weighting the spectra. The illustrated weighting function W weights the low frequencies (Freq), plotted here in random units, high and decreases exponentially, so high frequencies are weighted only weakly.

Figure 10:
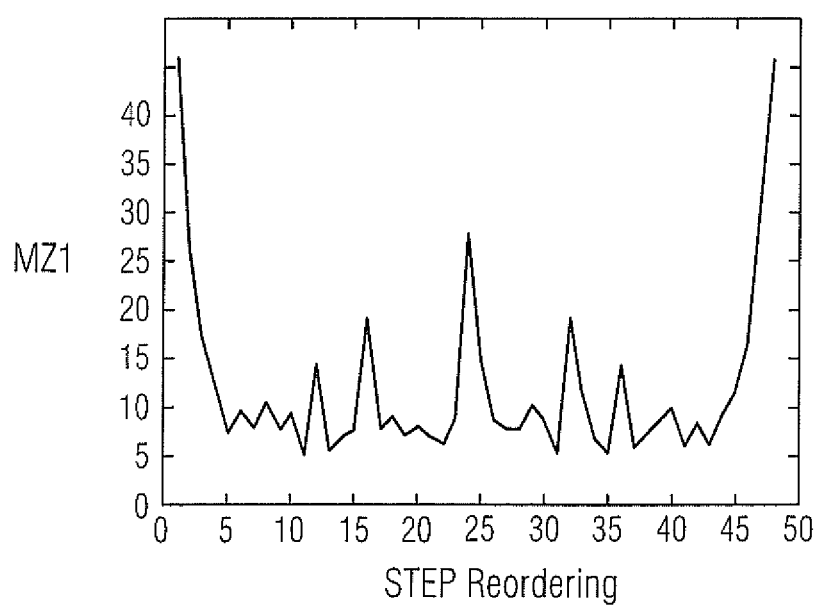
FIG. 10 shows results of a measured value MZ1 in relation to various examined orders $Ord_k$.

FIG. 10 shows exemplary results of a measured value MZ1 in relation to different examined orders $Ord_k$, which are designated "STEP Reordering" here. This is because the illustrated orders were obtained by a variation in a starting order by steps having the increments plotted on the abscissa, i.e. the increment "1" corresponds to the starting order ($Traj_1$, $Traj_2$, . . . , $Traj_N$), the increment "2" corresponds to an order ($Traj_1$, $Traj_3$, $Traj_5$, . . . $Traj_{N-1}$, $Traj_2$, $Traj_4$, $Traj_6$, . . . $Traj_N$) etc. Therefore, the orders chosen here, starting from the first k-space trajectories Traj1, each specify as the next one the next k-space trajectory corresponding to the increment. In order to cover all N k-space trajectories as a whole, the next k-space trajectory in each case, which has previously not been included in the order, is indicated as the next one in the order if the next k-space trajectory according to the increment is already included in the order.

In the illustrated example, the order having the increment 11 has the lowest measured value MZ1 and is therefore most suitable for avoiding errors caused by undersampling artifacts in parameter maps determined by means of MRF methods.

A further, additional or alternative comparison 107' of test signal characteristics TSV(x) with ideal signal characteristics iSV(x) can be a comparison of the test signal characteristics TSV(x) with a comparison rule VR (block 107'.1). In this embodiment, the comparison rule, according to matching of the test signal characteristics TSV(x) with comparison signal characteristics of a dictionary, with which at least one parameter is associated, chooses, for each associated parameter, the parameter value that matches the comparison signal characteristic with the best match with the test signal characteristic TSV(x), and associates this parameter value P(x) with the image point x of the test signal characteristic TSV(x).

This parameter value P(x) can be compared with a parameter value iP(x) expected for the corresponding image point in image data of the examination object if this is known or can be determined (block 107'.5). The expected parameter value iP(x) can be determined, at least for test signal characteristics TSV(x), which are simulated test signal characteristics, using the examination object forming the basis of the description O (block 107'.3).

In the comparison 107'.5, in addition or as an alternative to a comparison of parameter values P(x) of different orders $Ord_k$ with expected parameter values iP(x), comparisons of parameter values P(x) of different orders can also be made with each other, for example for different image points x as well. This can be expedient if a spatial distribution of the parameter values P(x) can be assumed, particularly if a spatially homogeneous distribution is expected. This is because, in such a situation, a comparison of parameter values P(x) for different image points x with respect to an order $Ord_k$, can provide information about the correctness of the spatial distribution of the parameter values obtained with the parameter values P(x). For example, the determined parameter values P(x) should not be subjected to great variations if a homogeneous examination object was examined. The quality of the parameter values P(x) determined for the respective orders $Ord_k$ can be made more easily comparable for example by means of a second measured value MZ2. A measured value of this kind can reflect, for example, a statistical difference in the determined parameter values P(x) from the expected parameter values iP(x) and/or take into account a measure of homogeneity of the determined parameter values P(x) over different image points x. The effects of undersampling of the underlying k-space trajectories can be displayed by the determined parameter values P(x) in parameter maps created by MRF methods.

From the orders $Ord_k$ that result due to the variation, a preferred order $Ord_b$ is determined (block 109) by taking into account the results of the employed comparisons 107, 107' of test signal characteristics TSV(x) with each other and/or with ideal signal characteristics iSV(x).

The results of the comparisons can be determined differential signals Diff(t), reordered differential signals Diff(o), spectra Sp of frequency analyses of differential signals, or measured values MZ1 or MZ2 obtained from the comparisons.

Determination of the preferred order $Ord_b$ can take into account different comparisons of test signal characteristics TSV(x) with ideal signal characteristics iSV(x) per obtained order $Ord_k$ and/or comparisons of different test signal characteristics TSV(x) of one order $Ord_k$ with each other, individually or combined.

Figure 2:
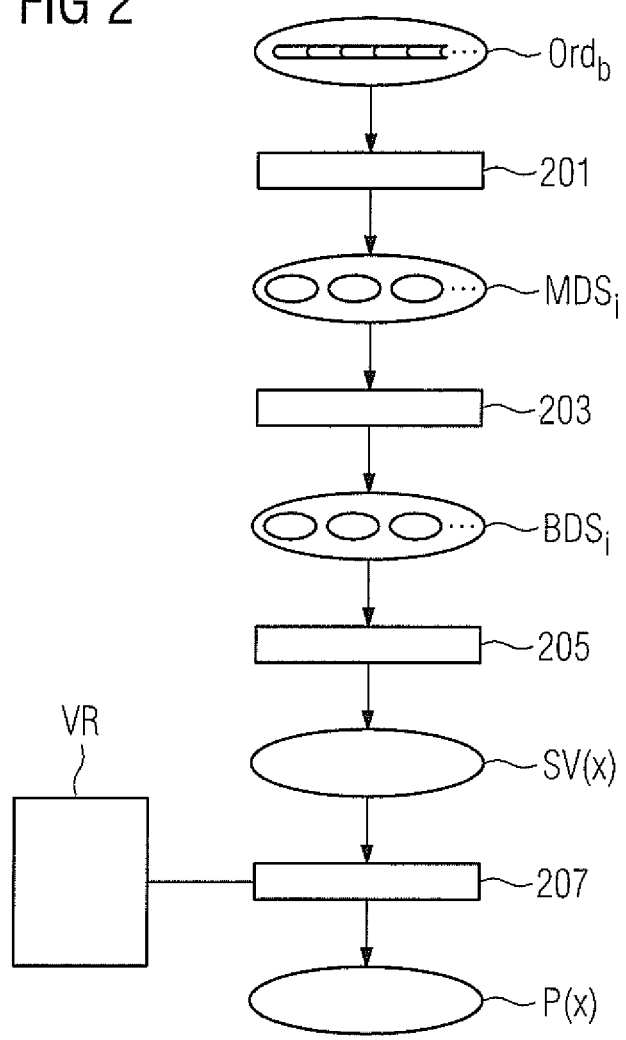
FIG. 2 is a flowchart of inventive methods for scanning scan data of an examination object for a magnetic resonance fingerprinting method, and for creating parameter maps of an examination object by magnetic resonance fingerprinting.

FIG. 2 is a flowchart of a method for scanning scan data of an examination object for a magnetic resonance fingerprinting method and, furthermore, a method for creating parameter maps of an examination object by means of magnetic resonance fingerprinting.

For an MRF scan on an examination object, a preferred order $Ord_b$ of a chosen sampling pattern, determined according to a method described in respect of FIG. 1, is loaded into a computer.

Scan data of an examination object are obtained by operation of a magnetic resonance scanner (block 201) along k-space trajectories of a chosen sampling pattern, arranged in the preferred order $Ord_b$. One undersampled scan data set $MDS_i$ is created respectively for each k-space trajectory, from the scanned scan data. The scan data sets $MDS_i$ are therefore in a chronological order that corresponds to the preferred order. It is also possible to combine a number of scan data scanned per k-space trajectory to form an undersampled scan data set $MDS_i$. A scan data set $MDS_i$ of this kind is less severely undersampled and thus should be less affected by undersampling artifacts. Combined scan data sets $MDS_i$ of this kind have a lower temporal resolution, however.

Image data sets $BDS_i$ are in each case reconstructed (block 203) from the scan data sets $MDS_i$, and these are also in a chronological order that corresponds to the preferred order. An image data set $BDS_i$ contains at least one image point x.

For at least one image point x of the reconstructed image data sets $BDS_i$, a signal characteristic SV(x) is determined that reproduces the signal intensity of the image point in a chronological sequence (block 205) corresponding to the preferred order.

At least one parameter P(x) is determined for at least one image point x, for which a signal characteristic has been determined, by comparison of the determined signal characteristics SV(x) with a comparison rule VR. The comparison rule VR matches the signal characteristics SV(x) with comparison signal characteristics stored in the comparison rule VR, with which characteristics at least one parameter is associated, so as to choose that parameter value which matches the comparison signal characteristic with the best match with the determined signal characteristic, and to associate this with the respective image point (block 207).

A comparison rule conventional in MRF methods can be used as the comparison rule VR. This can be the type of matching, known as pattern matching. One parameter map having parameter values P(x) thus can be created per image point x of an examination object with the use of an MRF method.

Determination of a preferred order of N k-space trajectories, along which, in each case, an undersampled scan data set is to be scanned for an MRF scan, is therefore enabled so that artifacts in parameter maps created from the scan data sets by MRF methods are avoided.

Figure 11:
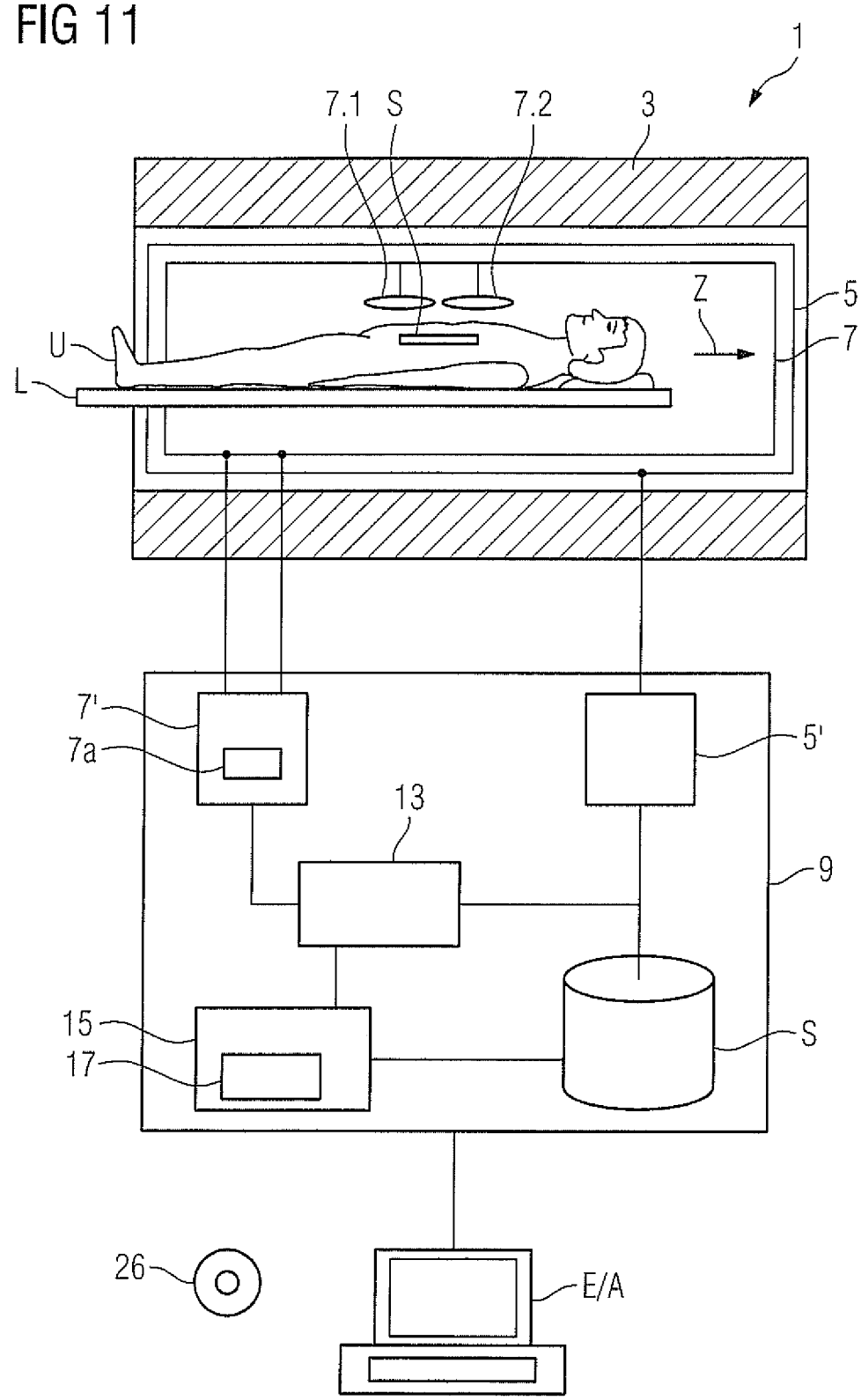
FIG. 11 schematically illustrates an inventive magnetic resonance apparatus.

FIG. 11 schematically illustrates an inventive magnetic resonance apparatus 1. This has a scanner 3 in which the basic magnetic field is generated, a gradient coil arrangement 5 that generates the gradient fields, an RF antenna 7 for radiating and receiving radio-frequency signals, and a control computer 9 designed to implement the inventive method. In FIG. 11 these sub-units of the magnetic resonance system 1 are shown only schematically. The RF antenna 7 can be formed by a number of coils, such as schematically illustrated coils 7.1 and 7.2, or more coils, which can be designed either for only transmitting radio-frequency signals, or only for receiving the triggered radio-frequency signals, or for both.

In order to examine an examination object U, for example a patient or a phantom, the object U is introduced on a bed L into the scanner 3, and into the scanning volume thereof. The slice S represents an exemplary target volume of the examination object from which scan data can be recorded.

The control computer 9 controls the magnetic resonance apparatus 1 and can control the gradient coil arrangement 5 via a gradient controller 5' and the RF antenna 7 via an RF transceiver controller 7'. The RF antenna 7 has a number of channels via which signals can be transmitted or received.

The RF antenna 7, together with its RF transceiver controller 7', is responsible for generating and radiating (transmitting) a radio-frequency alternating field for manipulation of the nuclear spins in a region to be manipulated (for example in slices S to be scanned) of the examination object U. The center frequency of the radio-frequency alternating field, also called the B1 field, is conventionally close to the resonance frequency of the spins to be manipulated. In order to generate the B1 field, currents controlled by the RF transceiver controller 7' are applied in the RF antenna 7 to the RF coils. An inventive scan data distribution processor 7a, which can be encompassed, for example, in the RF transceiver controller 7', determines which scan data are inventively recorded, and with which data set and the scan data associated.

Furthermore, the control computer 9 has a determining processor 15, which provides, for example, strategies with which an inventive preferred order can be determined, in which k-space trajectories of a sampling pattern are to be sampled one after the other in an optimized manner according to the invention. An MRF unit 17 can be connected to the determining processor 15, and this is designed for carrying out MRF methods, and, in particular, has access to comparison rules and comparison signal characteristics. The control computer 9 is designed as a whole to implement the inventive method.

An arithmetic unit 13 encompassed in the control computer 9 is designed to perform all arithmetic operations necessary for the required scans and determinations. Interim results and results required for this or determined in this connection can be stored in a memory M of the control computer 9. The illustrated units should not necessarily be interrupted as physically separate units, but they merely constitute a subdivision into functional units which can be implemented in fewer units or even in just a single physical unit.

Control commands can be directed, for example by a user, to the magnetic resonance system, and/or results of the control computer 9 such as image data, can be displayed via an input/output device E/A of the magnetic resonance apparatus 1.

The method described herein can be embodied in the form of program code that causes the described method to be implemented when an electronically readable data carrier 26, with the electronically readable code stored thereon, when the data carrier 26 is loaded into the control computer 9 of the magnetic resonance apparatus 1.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining a preferred order of k-space trajectories along which data are to be entered for a magnetic resonance fingerprinting (MRF) scan, said method comprising:

in a computer, selecting a sampling pattern for entering MR data acquired from a subject in an MRF scan, said sampling pattern comprising N k-space trajectories along each of which Nyquist undersampled acquired scan data are to be entered, from which respective scan data sets will be created, from which respective images are reconstructed, with each reconstructed image being comprised of image points and wherein each image point has a signal characteristic, and wherein one parameter of the subject is determined, for each image point, from the respective signal characteristics of that same image point in said reconstructed images by implementing a comparison according to a comparison rule;

in said computer, varying an order in which the N k-space trajectories are to be sequentially sampled in k-space, thereby producing at least two different orders;

in said computer, obtaining test signal characteristics for each of said at least two different orders and comparing said test signal characteristics with each other and/or with ideal signal characteristics in order to obtain a test signal comparison result;

in said computer, determining a preferred order, from among said at least two different orders, dependent on said test signal comparison result; and making said preferred order available in electronic form from said computer in a format for use in executing said MRF scan.

2. A method as claimed in claim 1 comprising:

operating an MR data acquisition scanner in order to obtain undersampled test scan data sets, entered along said N k-space trajectories, and reconstructing test image data sets from said undersampled test scan data sets, and determining said test signal characteristics from said test image data sets.

3. A method as claimed in claim 1 comprising determining said test signal characteristics by executing a simulation in said computer.

4. A method as claimed in claim 1 comprising determining said ideal signal characteristics from comparison signal characteristics stored in an MRF dictionary.

5. A method as claimed in claim 4 comprising determining said ideal characteristics from said MRF dictionary according to said comparison rule by comparison with said test signal characteristics.

6. A method as claimed in claim 4 comprising determining said ideal signal characteristics by selecting, in said computer, a comparison signal characteristic that best fits respective values of said parameter.

7. A method as claimed in claim 1 comprising comparing said at least two orders by:
   determining at least one signal characteristic of at least one image point;
   determining ideal signal characteristics of selected image points corresponding to said determined test signal characteristics;
   forming a differential signal of the determined test signal characteristics and their corresponding, determined ideal signal characteristics; and
   determining said preferred order from said differential signals.

8. A method as claimed in claim 6 comprising comparing said orders by making a frequency analysis of each of the differential signals and using a result of said frequency analysis as a fixed sequence for each order, and determining said preferred order from the fixed sequence for each order.

9. A method as claimed in claim 8 comprising weighting the results of the frequency analysis so as to weight low frequencies higher than high frequencies, and selecting, as said preferred order, an order among said at least two orders that has an optimally low value for a sum of the respective weighted results of each frequency analysis.

10. A method as claimed in claim 1 comprising determining said test signal characteristics by executing a simulation in said computer for each of the N k-space trajectories, by determining a component of said at least one same image point reconstructed from the respective scan data sets, associated with image points other than said at least one same image point.

11. A method as claimed in claim 1 comprising comparing said at least two orders in order to determine said preferred order by:
   determining test signal characteristics for said at least one image point;
   comparing the test signal characteristics said with said comparison rule, said comparison rule causing matching of test signal characteristics with comparison signal characteristics, with which said at least one parameter is associated, so as to select a parameter value that corresponds to the comparison signal characteristic having a best match with the test signal characteristic, and that associated that parameter value with the respective image point of the test signal characteristic; and
   comparing the associated parameter value with parameter values for other image points and/or with a parameter value expected for the same image point in the subject.

12. A method for operating a magnetic resonance (MR) data acquisition scanner in order to executed a magnetic resonance fingerprinting (MRF) scan, said method comprising:
   in a computer, selecting a sampling pattern for entering MR data acquired from a subject in an MRF scan, said sampling pattern comprising N k-space trajectories along each of which Nyquist undersampled acquired scan data are to be entered, from which respective scan data sets will be created, from which respective images are reconstructed, with each reconstructed image being comprised of image points and wherein each image point has a signal characteristic, and wherein one parameter of the subject is determined, for each image point, from the respective signal characteristics of that same image point in said reconstructed images by implementing a comparison according to a comparison rule;
   in said computer, varying an order in which the N k-space trajectories are to be sequentially sampled in k-space, thereby producing at least two different orders;
   in said computer, obtaining test signal characteristics for each of said at least two different orders and comparing said test signal characteristics with each other and/or with ideal signal characteristics in order to obtain a test signal comparison result;
   in said computer, determining a preferred order, from among said at least two different orders, dependent on said test signal comparison result; and
   operating said MR data acquisition scanner from said computer to execute said MRF scan, using said preferred order for entering scan data along said N k-space trajectories.

13. A method for creating a parameter map of an examination subject from a magnetic resonance fingerprinting (MRF) scan, said method comprising:
   in a computer, selecting a sampling pattern for entering MR data acquired from a subject in an MRF scan, said sampling pattern comprising N k-space trajectories along each of which Nyquist undersampled acquired scan data are to be entered, from which respective scan data sets will be created, from which respective images are reconstructed, with each reconstructed image being comprised of image points and wherein each image point has a signal characteristic, and wherein one parameter of the subject is determined, for each image point, from the respective signal characteristics of that same image point in said reconstructed images by implementing a comparison according to a comparison rule;
   in said computer, varying an order in which the N k-space trajectories are to be sequentially sampled in k-space, thereby producing at least two different orders;
   in said computer, obtaining test signal characteristics for each of said at least two different orders and comparing said test signal characteristics with each other and/or with ideal signal characteristics in order to obtain a test signal comparison result;
   in said computer, determining a preferred order, from among said at least two different orders, dependent on said test signal comparison result;
   operating said MR data acquisition scanner from said computer to execute said MRF scan, using said preferred order for entering scan data along said N k-space trajectories;
   in said computer, creating at least one Nyquist undersampled scan data set from said scan data along said k-space trajectories;
   in said computer, reconstructing image data sets from the undersampled scanned data sets;
   in said computer, determining at least one single characteristic of said at least one image point of the reconstructed image data sets;
   in said computer, determining at least one parameter of the object for each image point by comparing the determined signal characteristics with said comparison rule by matching the signal characteristics with comparison signal characteristics, with which at least one parameter is associated, in order to select a respective parameter value that corresponds to the comparison signal characteristics that has a best match with the determined signal characteristic, and associating said parameter value with the respective image point; and generating a parameter map that comprises each of said parameter values for each image point.

14. A magnetic resonance (MR) apparatus comprising:

an MR data acquisition scanner;

a computer configured to select a sampling pattern for entering MR data acquired from a subject in an MRF scan, said sampling pattern comprising N k-space trajectories along each of which Nyquist undersampled acquired scan data are to be entered, from which respective scan data sets will be created, from which respective images are reconstructed, with each reconstructed image being comprised of image points and wherein each image point has a signal characteristic, and wherein one parameter of the subject is determined, for each image point, from the respective signal characteristics of that same image point in said reconstructed images by implementing a comparison according to a comparison rule;

said computer being configured to vary an order in which the N k-space trajectories are to be sequentially sampled in k-space, thereby producing at least two different orders;

said computer being configured to obtain test signal characteristics for each of said at least two different orders and comparing said test signal characteristics with each other and/or with ideal signal characteristics in order to obtain a test signal comparison result;

said computer being configured to determine a preferred order, from among said at least two different orders, dependent on said test signal comparison result; and said computer being configured to operate said MR data acquisition scanner to execute said MRF scan, using said preferred order for entering scan data along said N k-space trajectories.

15. A non-transitory, computer-readable data storage medium encoded with programming instructions, said storage medium being loaded into a computer system of a magnetic resonance (MR) apparatus, and said programming instructions causing said computer system to:

select a sampling pattern for entering MR data acquired from a subject in an MRF scan, said sampling pattern comprising N k-space trajectories along each of which Nyquist undersampled acquired scan data are to be entered, from which respective scan data sets will be created, from which respective images are reconstructed, with each reconstructed image being comprised of image points and wherein each image point has a signal characteristic, and wherein one parameter of the subject is determined, for each image point, from the respective signal characteristics of that same image point in said reconstructed images by implementing a comparison according to a comparison rule;

vary an order in which the N k-space trajectories are to be sequentially sampled in k-space, thereby producing at least two different orders;

obtain test signal characteristics for each of said at least two different orders and comparing said test signal characteristics with each other and/or with ideal signal characteristics in order to obtain a test signal comparison result;

determine a preferred order, from among said at least two different orders, dependent on said test signal comparison result; and make said preferred order available in electronic form from said computer in a format for use in executing said MRF scan.

16. A method as claimed in claim 1, wherein varying the order in which the N k-space trajectories are to be sequentially sampled in k-space to produce at least two different orders includes randomly varying the order.

17. A method as claimed in claim 1, wherein varying the order in which the N k-space trajectories are to be sequentially sampled in k-space to produce at least two different orders includes performing a periodic variation that includes a rotation about a predetermined angular increment.

18. A method as claimed in claim 1, wherein varying the order in which the N k-space trajectories are to be sequentially sampled in k-space corresponds to a reordering of undersampling artifacts associated with the Nyquist undersampled acquired scan data such that the preferred order yields a reduction in artifacts in the reconstructed images.

* * * * *